(12) United States Patent
Gaudin et al.

(10) Patent No.: US 10,833,249 B2
(45) Date of Patent: Nov. 10, 2020

(54) MAGNETIC MEMORY CELL OF CURRENT PROGRAMMING TYPE

(71) Applicants: Centre National de la Recherche Scientifique, Paris (FR); Commissariat à l'Énergie Atomique et aux Énergies Alternatives, Paris (FR)

(72) Inventors: Gilles Gaudin, Le Sappey en Chartreuse (FR); Ioan Mihai Miron, Grenoble (FR); Alexandru Trifu, Grenoble (FR)

(73) Assignees: Centre National de la Recherche Scientifique, Paris (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/707,405

(22) Filed: Sep. 18, 2017

(65) Prior Publication Data

US 2019/0088853 A1    Mar. 21, 2019

(51) Int. Cl.
*H01L 43/02* (2006.01)
*H01L 43/12* (2006.01)
(Continued)

(52) U.S. Cl.
CPC .......... *H01L 43/02* (2013.01); *G11C 11/161* (2013.01); *G11C 11/1675* (2013.01);
(Continued)

(58) Field of Classification Search
CPC ......... H01L 43/02; H01L 43/08; H01L 43/12; H01L 43/10; H01L 43/00–14; H01L 27/222–228; H01L 29/66984; H01L 43/04; H01L 43/06–065; H03B 15/00–006; G01R 33/07–077;
(Continued)

(56) References Cited

U.S. PATENT DOCUMENTS

| | | | |
|---|---|---|---|
| 2010/0209737 A1* | 8/2010 | Bian | G11B 5/65 428/827 |
| 2012/0018822 A1* | 1/2012 | Gaudin | B82Y 25/00 257/421 |

(Continued)

FOREIGN PATENT DOCUMENTS

| FR | 2 042 303 A1 | 2/1971 |
|---|---|---|
| FR | 2 963 152 A1 | 1/2012 |

(Continued)

OTHER PUBLICATIONS

Trifu, Spin Orbit Torque measurements in Pt-based heavy metal/ferromagnetic heterostructures with in-plane magnetic anisotropy. Grenoble. Jun. 16, 2017;1-54. Powerpoint presentation.

*Primary Examiner* — Nelson Garces
(74) *Attorney, Agent, or Firm* — Wolf, Greenfield & Sacks, P.C.

(57) ABSTRACT

A memory cell, including a stack of: a conductive layer of a conductive material including a first chemical element; an oxide layer sufficiently thin to allow the flowing of a current by tunnel effect; and a conductive ferromagnetic layer having a programmable magnetization and including a second chemical element, wherein the oxide layer includes the first and second chemical elements.

19 Claims, 1 Drawing Sheet

(51) Int. Cl.
   *H01L 43/10*    (2006.01)
   *H01L 43/08*    (2006.01)
   *G11C 11/16*    (2006.01)

(52) U.S. Cl.
   CPC .............. *H01L 43/08* (2013.01); *H01L 43/10* (2013.01); *H01L 43/12* (2013.01)

(58) Field of Classification Search
   CPC .......... G01R 15/202; G11C 11/14–161; G11C 11/18; G11C 19/10; G11C 11/1675; H01F 10/32–3295
   USPC ........................................................ 257/421
   See application file for complete search history.

(56) References Cited

U.S. PATENT DOCUMENTS

| | | | | |
|---|---|---|---|---|
| 2015/0200003 | A1* | 7/2015 | Buhrman | G11C 11/18 365/158 |
| 2016/0099407 | A1* | 4/2016 | Lim | H01L 43/08 257/425 |
| 2018/0005746 | A1* | 1/2018 | Thomas | B24B 37/20 |
| 2018/0268887 | A1* | 9/2018 | Endo | G11C 11/161 |

FOREIGN PATENT DOCUMENTS

| | | |
|---|---|---|
| FR | 2 963 153 A1 | 1/2012 |
| FR | 2 966 636 A1 | 4/2012 |
| FR | 3 031 622 A1 | 7/2016 |
| FR | 3 042 634 A1 | 4/2017 |

\* cited by examiner

MAGNETIC MEMORY CELL OF CURRENT PROGRAMMING TYPE

BACKGROUND

The present disclosure relates to a magnetic memory cell, and more particularly to a magnetic memory cell of current programming type.

DISCUSSION OF THE RELATED ART

Patents and patent applications FR2963152, FR2963153, FR2966636, FR3031622, FR2042303, and FR3042634, of the same applicants, describe magnetic memory cells programmable with a current. These documents are incorporated herein by reference.

FIG. 1 is a simplified cross-section view of a memory cell of a type described in the above-mentioned documents.

The memory cell comprises a pad 102 on a conductive track 104. Conductive track 104 is for example formed on a support, not shown, for example a silicon wafer coated with silicon oxide. Conductive track 104 connects terminals A and B. Pad 102 is formed of a stack of layers. The stack comprises, starting from electrically conductive layer 104, an electrically conductive layer 106, for example metallic, a ferromagnetic layer 108, for example electrically conductive, a layer 110 made of a non-magnetic material, a layer 112 comprising one or a plurality of magnetic layers, and an electrode 114 connected to a terminal C.

In the shown example, the materials, thicknesses, and forming modes of layers 106, 108, and 110 are selected so that ferromagnetic layer 108 has a magnetization 116 in a direction orthogonal to the main plane of the layers. In another example, the magnetization of the ferromagnetic layer is parallel to the plane of the layers.

Lists of materials capable of forming the various layers are provided in the above-mentioned documents. Layers 106 and 110 in contact with layer 108 are made of materials having a strong spin-orbit coupling, alone and/or at their interfaces with layer 108.

As an example, conductive layer 106 contains platinum, tungsten, or tantalum. Layer 106 and conductive track 104 may be made of a same material. Layer 106 may be omitted, the role of layer 106 being played by the portion of conductive track 104 located under the pad, and this portion of track 104 may or may not be thicker than the rest of track 104.

Ferromagnetic layer 108 may contain materials such as iron, cobalt, or nickel, an alloy of these elements, or cobalt iron boride, and may comprise one or a plurality of layers, each for example containing one of these materials. The thickness of layer 108 is typically smaller than 3 nm.

Non-magnetic layer 110 topping ferromagnetic layer 108 may be made of a conductive material, but is preferably made of an insulating material sufficiently thin such that an electric current may pass through it by tunnel effect. Layer 110 may be made of an oxide such as $SiO_X$, $AlO_X$, $MgO_X$, $TaO_X$, $HfO_X$, or of a nitride such as SiN, $BN_X$.

The magnetic material(s) of layer 112 are formed in conditions such that layer 112 keeps an intangible magnetization (trapped magnetization layer). The direction of the trapped magnetization of layer 112 is preferably parallel to the direction of magnetization 116 of ferromagnetic layer 108.

To program the memory cell, a programming current I is circulated from terminal A to terminal B. The configuration of the pad and the track, for example their shape in top view, is for example provided so that the circulation of current I causes the layer 112 to be programmed to have its magnetization in a selected direction, for example, an upward or downward direction. Various configurations of the pad and of the track are described in the above-mentioned documents. A magnetic field applied to the memory cell during the programming and/or a magnetic coupling with an additional magnetic layer present in the pad, or a magnetic region close to the pad, may also be provided. The magnetic field, for example, radiated by such a magnetic layer or magnetic region, for example has a component orthogonal to magnetization 116 and located in the plane formed by the direction of current I and that of magnetization 116. The programmed direction, for example, upwards or downwards, is a function of the direction of current I and/or of the path followed by current I in the track under and around the pad and/or of the direction of the magnetic field and/or of the magnetic coupling.

To read from the memory cell, the electric resistance is for example measured between terminal C and any of terminals A and B. A high electric resistance corresponds to magnetizations of layers 108 and 112 in opposite directions, and a low electric resistance corresponds to magnetizations of layers 108 and 112 in the same direction. The high or low value of the electric resistance corresponds to the binary value programmed in the memory cell.

The memory cell of FIG. 1 may be broken up in two structures: a storage structure comprising track 104 provided with terminals A and B and layers 106, 108, and 110, and a readout structure comprising, in the example given hereabove, layers 112 and 114 and terminal C. With the same storage structure, various readout modes may be envisaged, for example, an optical readout.

The memory cell of FIG. 1 raises various issues. In particular, the programming current is desired to be decreased. Indeed, a high programming current causes a significant power consumption for the programming, which adversely affects the use of a device comprising such memory cells, particularly for mobile applications. Further, a high programming current may cause an accelerated aging of the memory cell along the successive programmings. Further, a high programming current requires large components, such as transistors, to supply this current, which raises compactness issues. Such issues are crucial, for example, for an electronic chip comprising several millions, or even several billions, of memory cells.

Another problem is that the information stored in the memory cell risks deleting over the years, for example, after more than ten years, in particular when the memory cell is submitted for long periods to high temperatures, for example, higher than 85° C. for consumer electronics applications or for example higher than 160° C. for automotive applications.

SUMMARY

An embodiment provides overcoming all or part of the above disadvantages.

An embodiment provides a magnetic memory cell with a decreased programming current.

An embodiment provides a memory cell where the stored information is particularly stable after several years, even when the memory cell is submitted to high temperatures for long periods.

Thus, an embodiment provides a memory cell comprising a stack of: a conductive layer of a conductive material comprising a first chemical element; an oxide layer sufficiently thin to allow the flowing of a current by tunnel effect; and a conductive ferromagnetic layer having a programmable magnetization and comprising a second chemical element, wherein the oxide layer comprises said first and second chemical elements.

According to an embodiment, said conductive layer comprises a further first chemical element, and the oxide layer comprises said further first chemical element.

According to an embodiment, said ferromagnetic layer comprises a further second chemical element, and the oxide layer comprises said further second chemical element.

According to an embodiment, the oxide layer is formed of a mixed-oxide material.

According to an embodiment, the ratio in the oxide layer of the proportion of the first chemical element to the proportion of the second chemical element is stoichiometric to within 20%.

According to an embodiment, the programmable magnetization is orthogonal to the plane of the layers.

According to an embodiment, said conductive layer is a conductive track arranged to allow the flowing of a programming current.

According to an embodiment, said conductive layer covers a portion of a conductive track arranged to allow the flowing of a programming current.

According to an embodiment, the oxide layer has a thickness smaller than 1 nm.

According to an embodiment, the second chemical element is cobalt.

According to an embodiment, the first chemical element is platinum.

According to an embodiment, the oxide layer contains, to within 20%, the same amount of platinum as of cobalt.

According to an embodiment, the ferromagnetic layer contains an alloy of boron, of iron, and of cobalt, the second chemical element being iron or cobalt, or the second chemical element being cobalt and the oxide layer further comprising iron.

According to an embodiment, the first chemical element is one of the elements from the group comprising tungsten, platinum, and tantalum.

According to an embodiment, the ferromagnetic layer has a thickness smaller than 3 nm.

According to an embodiment, the ferromagnetic layer is covered by a non-magnetic layer, the non-magnetic layer being covered by a readout structure.

According to an embodiment, the readout structure comprises a trapped magnetization layer.

A further embodiment provides a method of manufacturing the above memory cell, comprising a step of depositing the oxide layer by reactive deposition in the presence of oxygen.

A further embodiment provides a method of manufacturing the above memory cell, comprising the successive steps of: forming said conductive layer; oxidizing the surface of said conductive layer; depositing the ferromagnetic layer; and annealing.

The foregoing and other features and advantages will be discussed in detail in the following non-limiting description of dedicated embodiments in connection with the accompanying drawings.

DETAILED DESCRIPTION

Figure 1:
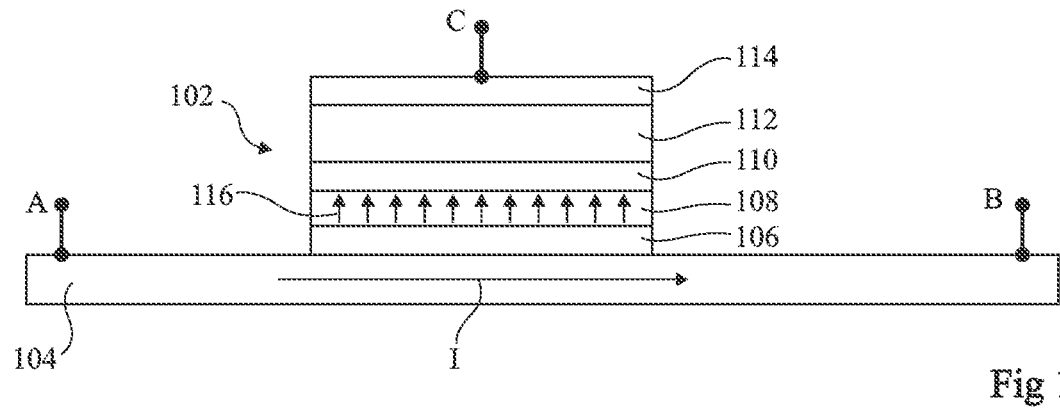
FIG. 1, described hereabove, is a simplified cross-section view of a magnetic memory cell.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying absolute position, such as terms "high", "low", etc. or relative position, such as terms "above", "under", "upper", etc., reference is made to the orientation of the concerned element in the concerned drawings, it being understood that, in practice, the described devices may have a different orientation.

Figure 2:
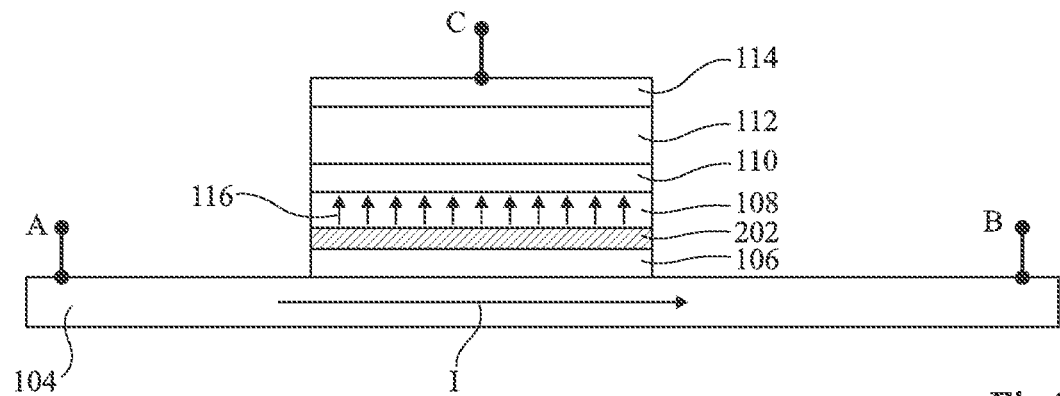
FIG. 2 is a simplified cross-section view of an embodiment of a magnetic memory cell.

FIG. 2 is a simplified cross-section view of an embodiment of a magnetic memory cell. The memory cell of FIG. 2 comprises elements identical or similar to those of the memory cell of FIG. 1, arranged identically or similarly.

The memory cell of FIG. 2 differs from that of FIG. 1 in that conductive and ferromagnetic layers 106 and 108 are not directly in contact with each other, but are separated by an oxide layer 202 arranged between layers 106 and 108 and in contact with layers 106 and 108. The oxide layer 202 comprises at least one element of the material of conductive layer 106, and at least one element of the material of ferromagnetic layer 108. The material of layer 102 is preferably a mixed-oxide.

As an example, conductive layer 106 is metallic, for example, made of platinum, ferromagnetic layer 108 is made of iron cobalt boride CoFeB, and layer 202 is then made, on the one hand, of platinum oxide and, on the other hand, of iron and/or cobalt oxide. In this example, layer 202 may contain, apart from oxygen, from 30% to 70% of platinum atoms and from 30% to 70% of iron and/or cobalt atoms. In the above example, platinum may for example be replaced with tungsten or tantalum.

The mixed oxide of layer 202 may be partially oxidized, for example by more than 70%, although it is preferably fully oxidized.

To enable a current to flow during the resistance measurement between terminal C and one of terminals A and B for the reading from the memory cell, it is provided for oxide layer 202 to be a tunnel-effect layer, that is, to be sufficiently thin for the readout current to be able to pass through it by tunnel effect. As an example, the thickness of oxide layer 202 is smaller than 1 nm.

The inventors have observed that the presence of oxide layer 202 enables the memory cell to be programmed by a particularly low programming current. This seems to be due to an increase of the spin-orbit couples created by the flowing of the programming current, which enable the magnetization to change direction.

Figure 3:
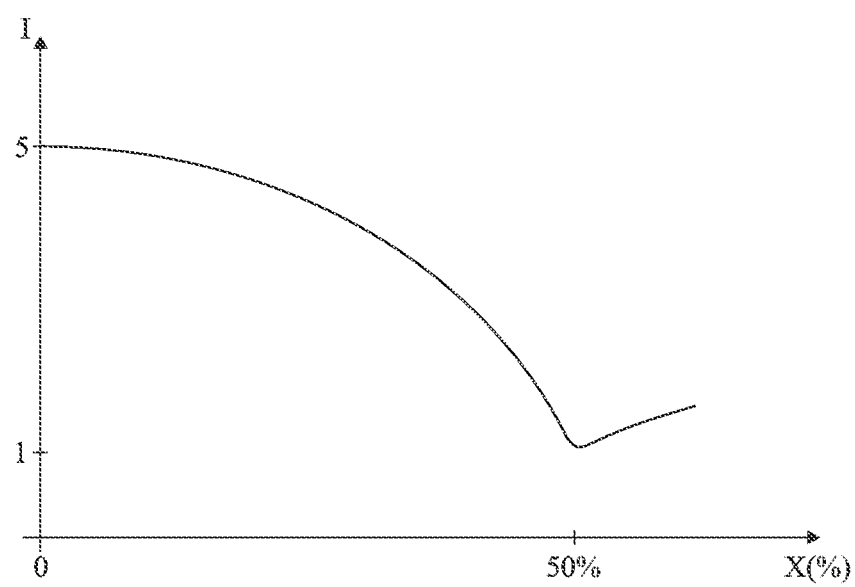
FIG. 3 schematically illustrates the programming current of a memory cell of the type in FIG. 2 according to a proportion of atoms in an oxide layer of the memory cell.

FIG. 3 schematically illustrates the programming current of an example of a memory cell of the type in FIG. 2 according to proportion X, in mixed oxide layer 202, of chemical element of ferromagnetic layer 108 among atoms other than oxygen. In this example, layer 106 is made of platinum, the ferromagnetic layer 108 is made of cobalt iron boride, and the atoms of the ferromagnetic layer present in oxide layer 202 are cobalt atoms. The curve schematically illustrates experimental and simulation results.

A zero proportion X corresponds to a platinum oxide layer $PtO_2$ and the programming current is then substantially the same as in the absence of layer 202. When proportion X rises above approximately 30%, the programming current strongly decreases and reaches a minimum value when proportion X is 50%, that is, when the proportions of the platinum and cobalt atoms are stoichiometric, that is, when there are as many platinum atoms as iron and/or cobalt atoms in mixed oxide layer 202. In this example, the current necessary for the programming is approximately 5 times lower when the proportions of the platinum and cobalt atoms in layer 202 are stoichiometric than in the absence of layer 202. It is thus advantageous to select in mixed oxide layer 202 platinum and cobalt proportions by a ratio close to the stoichiometric ratio, for example, to within less than 20%.

Further, the inventors have observed that, in the case where the magnetization of programmable ferromagnetic layer 108 is orthogonal to the plane of the layers, the presence of mixed oxide layer 202 enables the direction of the magnetization of layer 108 to advantageously remain particularly stable, even after several years and even when the memory cell is submitted to high temperatures for long periods. This seems to be due to an increase in the interfacial magnetic anisotropy perpendicular to the plane of the layers, caused by layer 202.

To manufacture mixed oxide layer 202, after having formed conductive layer 106, the elements to be oxidized of the material of layer 202 may be reactively deposited in the presence of oxygen, after which layer 202 may be covered with ferromagnetic layer 108. In the case of a conductive layer 106 made of a metallic material such as platinum, the upper surface of conductive layer 106 may also be oxidized, for example, with an oxygen plasma, ferromagnetic layer 108 may be formed, and an annealing step may be carried out to form mixed oxide layer 202 between layers 106 and 108.

Specific embodiments have been described. Various alterations, modifications, and improvements will readily occur to those skilled in the art. In particular, the different variations of the memory cell of FIG. 1 may apply to the memory cell of FIG. 2. In particular, magnetization 116 of layer 108, which is orthogonal to the plane of the layers as an example, may be parallel to the plane of the layers. Layer 106 may be omitted, the role of layer 106 being played by the portion of conductive track 104 located under the pad. A magnetic field applied to the memory cell during the programming and/or a magnetic coupling with an additional magnetic layer present in the pad or a magnetic region close to the pad may further be provided.

Further, although a specific material of ferromagnetic layer 108 has been described as an example, any material containing one or a plurality of magnetic elements such as iron, cobalt, or nickel, may be used for the ferromagnetic layer. The oxide of layer 202 may contain, in addition to one or a plurality of elements, for example metallic, of the material of layer 106, one or a plurality of the magnetic elements of the material of layer 108. In mixed oxide layer 202, apart from oxygen, the atoms of layer 106 and those of layer 108 are for example by a ratio close to the stoichiometric ratio, for example, to within less than 20%.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory cell, comprising a stack of:
   a conductive track arranged to allow the flowing of a programming current in the plane of the conductive track, said conductive layer comprising a conductive material;
   a conductive layer of a conductive material comprising at least a first chemical element;
   an oxide layer sufficiently thin to allow the flowing of a current by tunnel effect; and
   a conductive ferromagnetic layer having a programmable magnetization,
   said conductive ferromagnetic layer comprising at least a second chemical element,
   wherein said oxide layer:
      is arranged between said conductive layer comprising the at least the first chemical element and said conductive ferromagnetic layer comprising the at least the second chemical element,
      is in contact with said conductive layer comprising the at least the first chemical element and said conductive ferromagnetic layer comprising the at least the second chemical element, and
      comprises the at least the first chemical element and the at least the second chemical element, and
   wherein said oxide layer has a ratio of atoms of the at least the first chemical element to atoms of the at least the second chemical element that is greater than approximately 3:7 and less than approximately 7:3.

2. The memory cell of claim 1, wherein said conductive layer and said oxide layer comprise a same chemical element in addition to said first chemical element.

3. The memory cell of claim 1, wherein said ferromagnetic layer and said oxide layer comprise a same chemical element in addition to said second chemical element.

4. The memory cell of claim 1, wherein the oxide layer is formed of a mixed-oxide material.

5. The memory cell of claim 1, wherein the ratio of the oxide layer, of atoms of the at least the first chemical element to atoms of the at least the second chemical element is stoichiometric to within 20%.

6. The memory cell of claim 1, wherein the programmable magnetization is orthogonal to the plane of the layers.

7. The memory cell of claim 1, wherein said conductive layer covers a portion of a conductive track arranged to allow the flowing of a programming current.

8. The memory cell of claim 1, wherein the oxide layer has a thickness smaller than 1 nm.

9. The memory cell of claim 1, wherein the second chemical element is cobalt.

10. The memory cell of claim 9, wherein the first chemical element is platinum.

11. The memory cell of claim 10, wherein the oxide layer contains, to within 20%, the same amount of platinum as of cobalt.

12. The memory cell of claim 1, wherein the ferromagnetic layer contains an alloy of boron, of iron, and of cobalt, the second chemical element being iron or cobalt, or the second chemical element being cobalt and the oxide layer further comprising iron.

13. The memory cell of claim 1, wherein the first chemical element is one of the elements from the group comprising tungsten, platinum, and tantalum.

14. The memory cell of claim 1, wherein the ferromagnetic layer has a thickness smaller than 3 nm.

15. The memory cell of claim 1, wherein the ferromagnetic layer is covered by a non-magnetic layer, the non-magnetic layer being covered by a readout structure.

16. The memory cell of claim 15, wherein the readout structure comprises a trapped magnetization layer.

17. A method of manufacturing the memory cell of claim 1, comprising a step of depositing the oxide layer by reactive deposition in the presence of oxygen.

18. A method of manufacturing the memory cell of claim 1, comprising the successive steps of: forming said conductive layer; oxidizing the surface of said conductive layer; depositing the ferromagnetic layer; and annealing.

19. A memory cell, comprising a stack of:
- a conductive track arranged to allow the flowing of a programming current in the plane of the conductive track, said conductive layer comprising a conductive material and comprising in a portion thereof at least a first chemical element;
- an oxide layer sufficiently thin to allow the flowing of a current by tunnel effect; and
- a conductive ferromagnetic layer having a programmable magnetization, said conductive ferromagnetic layer comprising at least a second chemical element, wherein said oxide layer:
- is arranged between said portion of the conductive track comprising the at least the first chemical element and said conductive ferromagnetic layer comprising the at least the second chemical element,
- is in contact with said portion of the conductive track comprising the at least the first chemical element and said conductive ferromagnetic layer comprising the at least the second chemical element, and
- comprises the at least the first chemical element and the at least the second chemical element, and wherein said oxide layer has a ratio of atoms of the at least the first chemical element to atoms of the at least the second chemical element that is greater than approximately 3:7 and less than approximately 7:3.

* * * * *